(12) United States Patent
Kim et al.

(10) Patent No.: US 10,403,523 B2
(45) Date of Patent: Sep. 3, 2019

(54) SUBSTRATE PROCESSING APPARATUS

(71) Applicant: ASM IP Holding B.V., Almere (NL)

(72) Inventors: Soo Hyun Kim, Ansan-si (KR); Dae Youn Kim, Daejeon (KR); Izumi Arai, Tokyo (JP)

(73) Assignee: ASM IP Holding B.V., Almere (NL)

( * ) Notice: Subject to any disclaimer, the term of this patent is extended or adjusted under 35 U.S.C. 154(b) by 134 days.

(21) Appl. No.: 15/211,538

(22) Filed: Jul. 15, 2016

(65) Prior Publication Data

US 2017/0040204 A1 Feb. 9, 2017

(30) Foreign Application Priority Data

Aug. 7, 2015 (KR) .................. 10-2015-0111633

(51) Int. Cl.
*H01L 21/677* (2006.01)
*H01L 21/67* (2006.01)
*H01L 21/687* (2006.01)

(52) U.S. Cl.
CPC .. *H01L 21/67201* (2013.01); *H01L 21/67167* (2013.01); *H01L 21/67184* (2013.01); *H01L 21/67742* (2013.01); *H01L 21/67754* (2013.01); *H01L 21/68742* (2013.01)

(58) Field of Classification Search
CPC .......... H01L 21/67201; H01L 21/67754; B25J 9/043; B25J 15/0052
See application file for complete search history.

(56) References Cited

U.S. PATENT DOCUMENTS

| 6,196,154 | B1* | 3/2001 | Baumecker | C23C 14/56 118/718 |
|---|---|---|---|---|
| 8,060,252 | B2* | 11/2011 | Gage | H01L 21/67196 118/715 |
| 9,673,076 | B2* | 6/2017 | Roub | H01L 21/67748 |
| 2017/0018443 | A1* | 1/2017 | Lin | H01L 21/67201 |

* cited by examiner

*Primary Examiner* — Mark C Hageman
(74) *Attorney, Agent, or Firm* — Sand, Sebolt & Wernow Co., LPA

(57) ABSTRACT

Provided is a substrate processing apparatus including a load-lock chamber; a transfer chamber connected to the load-lock chamber; and one or more processing chambers connected to the transfer chamber. The transfer chamber includes a transfer arm that transfers a substrate between the load-lock chamber and the one or more processing chambers, the load-lock chamber includes a plurality of load-lock stations for accommodating a plurality of substrates as a matrix of m×n. According to the substrate processing apparatus, a time taken to transfer substrates may be reduced greatly, and productivity may be improved.

13 Claims, 13 Drawing Sheets

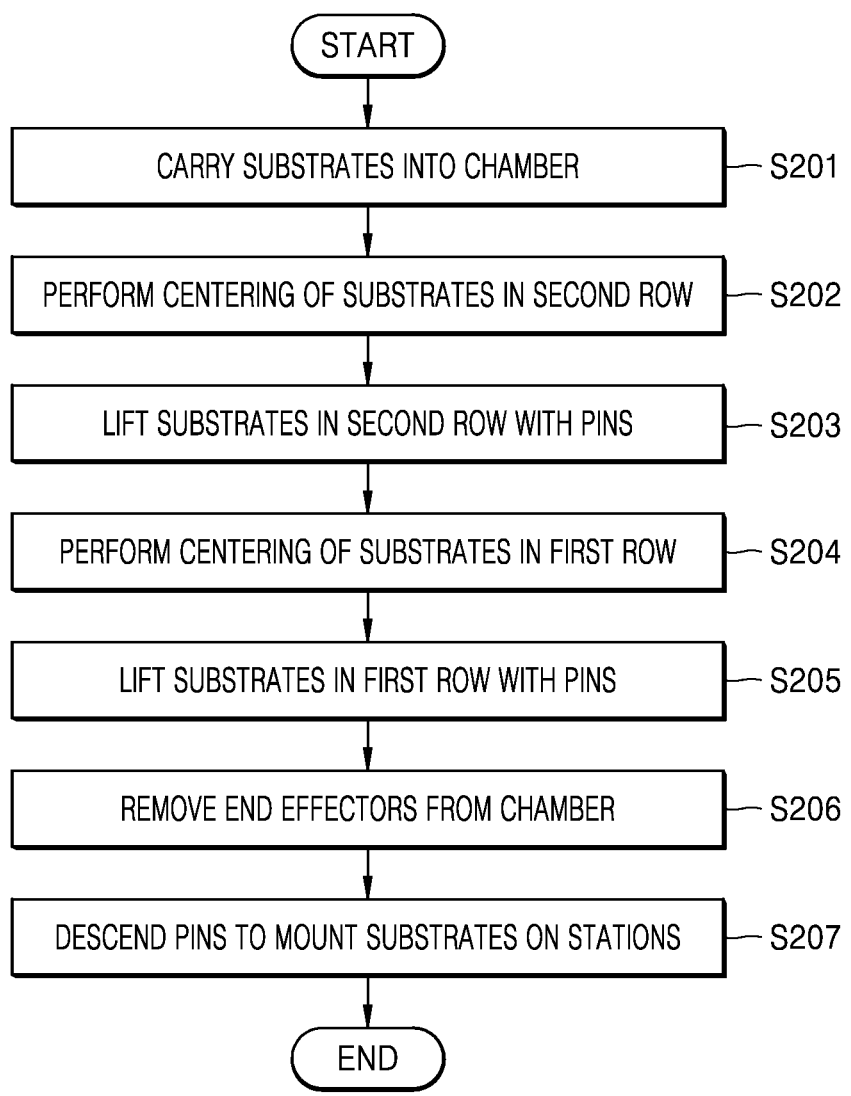

SUBSTRATE PROCESSING APPARATUS

TECHNICAL FIELD

One or more exemplary embodiments relate to a substrate processing apparatus, and more particularly, to a substrate processing apparatus capable of improving productivity by reducing a time taken to transport substrates greatly.

BACKGROUND

Substrate processing apparatuses are being widely used to process substrates, for example, to form thin films on a surface of a substrate. In order to process a plurality of substrates within a short period of time, a substrate processing apparatus that is provided with a plurality of substrates in a processing chamber and processes the plurality of substrates has been suggested. A robot arm capable of conveying the substrates into the processing chamber may be provided in order to arrange the plurality of substrates on stations, and it takes a lot of time period to load/unload the substrates. Therefore, there is a demand for an apparatus capable of loading/unloading the substrates rapidly for improving productivity.

DISCLOSURE OF THE INVENTION

Problems to be Solved

One or more exemplary embodiments provide a substrate processing apparatus capable of reducing a time taken to convey substrates greatly and improving productivity.

One or more exemplary embodiments provide a method of loading and unloading substrates, which may reduce a time taken to convey substrates greatly and improve productivity.

Means for Achieving Technical Goal

According to an aspect of the present invention, there is provided a substrate processing apparatus including: a load-lock chamber; a transfer chamber connected to the load-lock chamber; and one or more processing chambers connected to the transfer chamber, wherein the transfer chamber includes a transfer arm that transfers a substrate between the load-lock chamber and the one or more processing chambers, the load-lock chamber includes a plurality of load-lock stations for accommodating a plurality of substrates as a matrix of m×n, the transfer arm includes two or more transfer sub-arms having different heights from each other, and each of the two or more transfer sub-arms includes a plurality of end effectors.

The transfer arm may include m transfer sub-arms having different heights from each other. Each of the transfer sub-arms may include n end effectors. The n end effectors may be arranged in a direction perpendicular to a direction in which the end effectors of each transfer sub-arm enter and exit from the load-lock chamber. The m transfer sub-arms may be configured to sequentially unload substrates from the load-lock chamber or to sequentially load substrates into the load-lock chamber.

Alternatively, the transfer arm may include n transfer sub-arms having different heights from each other. Each of the transfer sub-arms may include m end effectors. The m end effectors may be arranged in parallel with a direction, in which the end effectors of each transfer sub-arm enter and exit from the load-lock chamber. The n transfer sub-arms may be configured to sequentially unload substrates from the load-lock chamber or to sequentially load substrates into the load-lock chamber.

At least two transfer sub-arms may be configured to simultaneously unload the substrates in the load-lock chamber or to simultaneously load the substrates into the load-lock chamber.

The plurality of load-lock stations may include pins that elevate the substrates to different heights according to the transfer sub-arms corresponding to the load-lock stations. The processing chamber may include a plurality of processing chamber stations for accommodating the plurality of substrates as a matrix of m×n. The processing chamber may not include a processing chamber transfer arm for transferring the substrates between the plurality of processing chamber stations.

The plurality of lock-lock stations may be arranged on one rotation mechanism, and the rotation mechanism may be configured to rotate in order to vary distances between the plurality of load-lock stations and the transfer arm.

According to an aspect of the present invention, there is provided a substrate processing apparatus including: a load-lock chamber; a transfer chamber connected to the load-lock chamber; and one or more processing chambers connected to the transfer chamber, wherein the one or more processing chambers include a plurality of processing chamber stations for accommodating a plurality of substrates as a matrix of m×n, and the one or more processing chambers do not include a transfer arm for transferring the plurality of substrates between the plurality of processing chamber stations (where m and n are integers between 2 and 10, m is a number of processing chamber stations in a direction in which a front end of the transfer arm extends into the processing chamber, and n is a number of processing chamber stations in a direction perpendicular to the direction in which the front end of the transfer arm extends into the processing chamber).

According to an aspect of the present invention, there is provided a method of unloading a plurality of substrates accommodated in a chamber, the method including: elevating the plurality of substrates on stations, the stations being arranged as a matrix of m×n in the chamber; inserting end effectors corresponding to the plurality of substrates under the plurality of substrates; and mounting the plurality of substrates respectively on the end effectors, where m and n are integers between 2 and 10, m is a number of the stations in a direction in which the end effectors extend into the chamber, and n is a number of the stations in a direction perpendicular to the direction in which the end effectors extend into the chamber.

The inserting of the end effectors corresponding to the plurality of substrates may include inserting the end effectors simultaneously under all of the plurality of substrates. The elevating of the plurality of substrates may include elevating the plurality of substrates to heights that are different from one another according to locations of the plurality of substrates. The heights may be different according to locations in a direction in which the end effectors extend into the chamber. An elevation height of each of the substrates may be lower for the substrates that are closer to the direction in which the end effectors are inserted and may be higher for the substrates that are farther from the direction in which the end effectors are inserted.

The stations may be arranged on a rotation mechanism, and the inserting of the end effectors corresponding to the plurality of substrates may include inserting the end effectors under some of the substrates, which are close to the direction in which the end effectors are inserted, and the method may further include, after mounting the plurality of substrates: drawing the plurality of substrates to outside of the chamber; and rotating the rotation mechanism so that some of the substrates, which are far from the direction in which the end effectors are inserted, approach to the direction in which the end effectors are inserted.

According to an aspect of the present invention, there is provided a method of loading a plurality of substrates into a chamber, the method including: locating end effectors that support the plurality of substrates and are arranged as a matrix of m×n on stations corresponding respectively to the end effectors; elevating pins from the stations in order to elevate the plurality of substrates from the end effectors; removing the end effectors under the plurality of substrates; and descending the pins in order to mount the plurality of substrates on the stations respectively, where m and n are integers between 2 and 10, m is a number of the stations in a direction in which the end effectors extend into the chamber, and n is a number of the stations in a direction perpendicular to the direction in which the end effectors extend into the chamber.

The locating the end effectors on the stations may include performing a first centering of substrates mounted on some of the end effectors with respect to the stations corresponding to the some of the end effectors, and the elevating the substrates from the end effectors may be performed with respect to the substrates that have undergone the first centering.

The method may further include: after mounting the substrates, performing a second centering of the substrates on remaining end effectors with respect to the stations corresponding to the end effectors; elevating the pins from the stations in order to elevate the substrates that have undergone the second centering from the remaining end effectors; removing the remaining end effectors under the substrates; and descending the pins in order to mount the substrates on the stations.

The end effectors supporting the first centering substrates may be fixed on transfer sub-arms corresponding to the end effectors, with the end effectors supporting the second centering substrates corresponding to the end effectors.

The locating of the end effectors supporting the plurality of substrates on the stations corresponding to the end effectors may be performed simultaneously with respect to at least two end effectors. The elevating of the substrates from the end effectors may include elevating the substrates to heights that are different according to locations of the plurality of substrates. The heights may be different from the locations of the plurality of substrates in a direction in which the end effectors extend into the chamber. The heights to which the plurality of substrates are elevated may be lowered when the substrates are close to the direction in which the end effectors are inserted and higher when the substrates are away from the direction in which the end effectors are inserted.

Effect of the Invention

According to one or more exemplary embodiments, a time taken to transfer substrates may be reduced greatly, and thereby improving productivity.

BRIEF DESCRIPTION OF THE DRAWINGS

FIG. 8 is a flowchart illustrating a method of loading substrates on stations by further performing a centering process.

DESCRIPTION OF EMBODIMENTS

Figure 1:
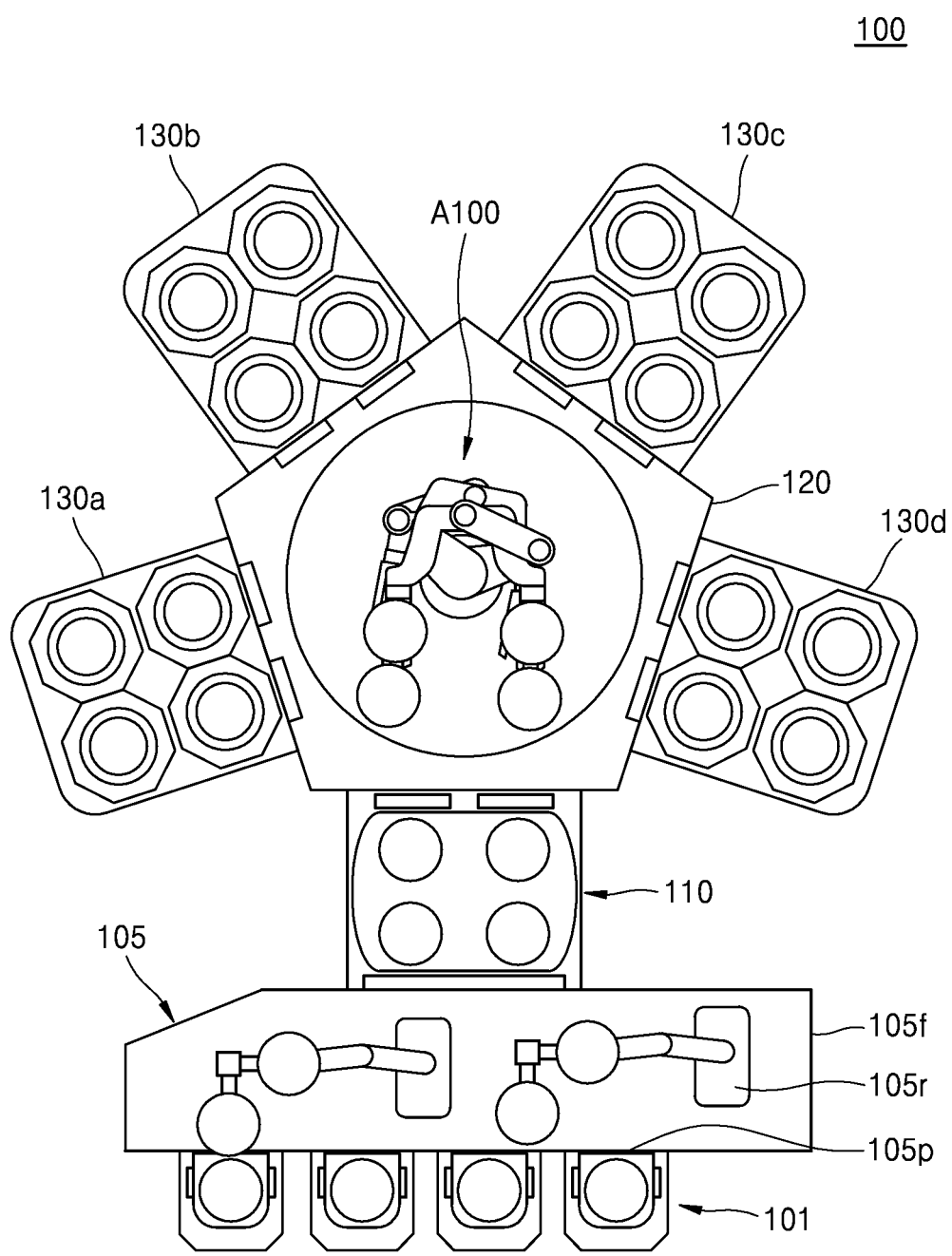
FIG. 1 is a plan perspective view of a substrate processing apparatus according to an exemplary embodiment.

The inventive concept may, however, be embodied in many different forms and should not be construed as being limited to the exemplary embodiments set forth herein; rather, these exemplary embodiments are provided so that this disclosure will be thorough and complete, and will fully convey the inventive concept to one of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. Like reference numerals denote like elements throughout the specification and drawings. In the drawings, the dimensions of structures are exaggerated for clarity of the inventive concept.

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope of protection of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain exemplary embodiment is differently implementable, a specific process procedure may be performed in different order described herein. For example, two successively-described processes may be performed at substantially the same time, or may be performed in reverse order.

In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes. As used herein, the term "and/or" includes any and all combinations of one or more of the associated listed items. The term "substrate" used herein may mean a substrate itself or a stack structure including a substrate and a predetermined layer or film formed thereon. Also, the expression "surface of a substrate" may mean an exposed surface of a substrate or an external surface of a predetermined layer or film formed thereon.

FIG. 1 is a plan perspective view of a substrate processing apparatus 100 according to an exemplary embodiment.

Referring to FIG. 1, processing chambers 130a, 130b, 130c, and 130d may be arranged in a circumferential direction around a transfer chamber 120 located at a center portion and attached thereon. The processing chambers 130a, 130b, 130c, and 130d may include a processing apparatus of an arbitrary type, e.g., may include a chamber for atomic layer deposition, a chamber for performing a chemical vapour deposition (CVD), a chamber for performing a physical vapour deposition (PVD), and a chamber for etching or another process that may be performed with respect to substrates during manufacturing processes of a semiconductor device.

In addition, a load-lock chamber 110 may be provided on a side surface of the transfer chamber 120. A transfer arm A100 that is configured to transfer substrates between the load-lock chamber 110 and the processing chambers 130a, 130b, 130c, and 130d may be disposed in the transfer chamber 120.

The load-lock chamber 110 may connect the transfer chamber 120 and an equipment front end module (EFEM) 105 to each other. The load-lock chamber 110 may have a side that is connected to the EFEM 105 via a gate valve, and the other side that is connected to the transfer chamber 120 via another gate valve. The load-lock chamber 110 may be configured to provide a vacuum atmosphere that is equal to or approximate to the transfer chamber 120 when the transfer arm A100 of the transfer chamber 120 loads or unloads the substrate. On the contrary, the load-lock chamber 110 may be switched to an atmospheric state when receiving an unprocessed substrate from the EFEM 105 or returning the substrate that has been processed already to the EFEM 105.

The EFEM 105 may include a frame 105f and a load port 105p having a side wall to which a substrate storage container such as a front open unified pod (FOUP) 101 may be attached. The frame 105f may include a door opener for opening and closing a door of the FOUP 101 therein, and a transfer robot 105r that transfers the substrate between the load port 105p and the load-lock chamber 110 may be disposed in the frame 105f. To do this, the transfer robot 105r may be provided so as to be moveable in the frame 105f, for example, a guide rail for guiding the movement of the transfer robot 105r may be further disposed on a lower bottom of the frame 105f.

The FOUP 101 may be disposed in front of the EFEM 105. The FOUP 101 is a substrate accommodation jig that may accommodate, transfer, and store substrates such as a substrate for photoreticle, a substrate for a liquid crystal display (LCD) panel, a wafer substrate for manufacturing a semiconductor device, and a substrate for a hard disk. The FOUP 101 contains the substrate in a sealed space so as to protect the substrates against impurities in the atmosphere or chemical pollution.

A plurality of load-lock stations and a plurality of processing chamber stations may be provided in the load-lock chamber 110 and in each of the processing chambers 130a, 130b, 130c, and 130d. In FIG. 1, in the load-lock chamber 110 and the processing chambers 130a, 130b, 130c, and 130d, the stations for substrates are arranged in 2×2 matrix, but one or more exemplary embodiments are not limited thereto.

In particular, the processing chamber stations in the processing chambers 130a, 130b, 130c, and 130d may further include barrier walls for isolating environments in the processing chambers from each other. The barrier walls may be configured to open at least partially when loading/unloading the substrates and to close when processing the substrates, so that the environments in the processing chambers may be different from each other.

Figure 2:
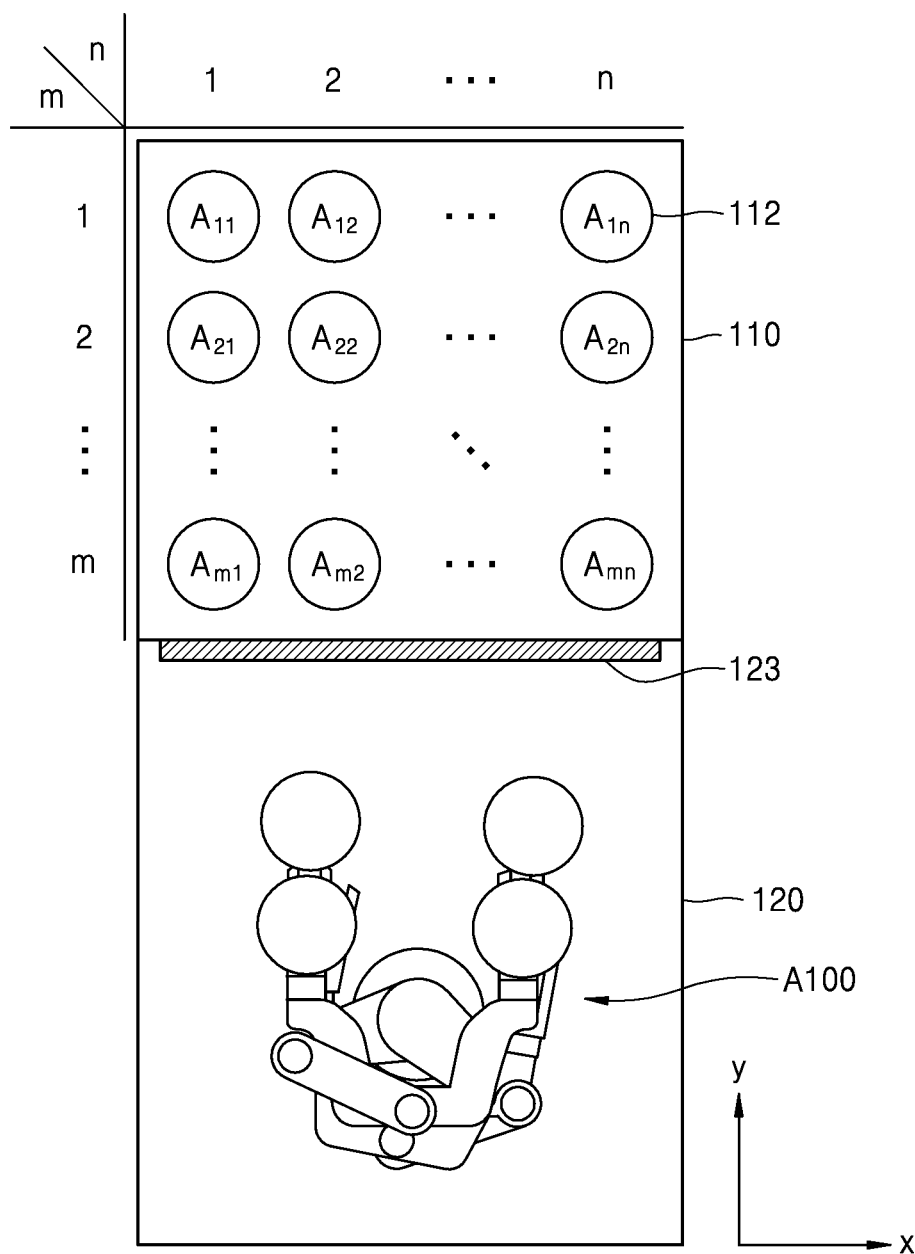
FIG. 2 is a schematic plan view showing a load-lock chamber and a transfer chamber.

FIG. 2 is a conceptual plan view of the load-lock chamber 110 and the transfer chamber 120 for generally describing the load-lock chamber 110 and the transfer chamber 120. In FIG. 2, the load-lock chamber 110 and the transfer chamber 120 are reversed upside down when compared to FIG. 1.

Referring to FIG. 2, a plurality of load-lock stations 112 may be arranged in the load-lock chamber 110. In particular, the load-lock stations 112 may be arranged in an m×n matrix. That is, the substrates may be accommodated in the load-lock chamber 110 as an m×n matrix form.

Here, m and n are integers ranging from 2 to 10, respectively. m denotes the number of load-lock stations 112 in a direction (y direction) in which a front end of the transfer arm A100 extends into the load-lock chamber 110, and n denotes the number of load-lock stations 112 in a direction (x direction) that is perpendicular to a direction in which the front end of the transfer arm A100 extends into the load-lock chamber 110. In some exemplary embodiments, m and n may be equal to each other. In some exemplary embodiments, m and n may be 2, respectively.

Figure 3A:
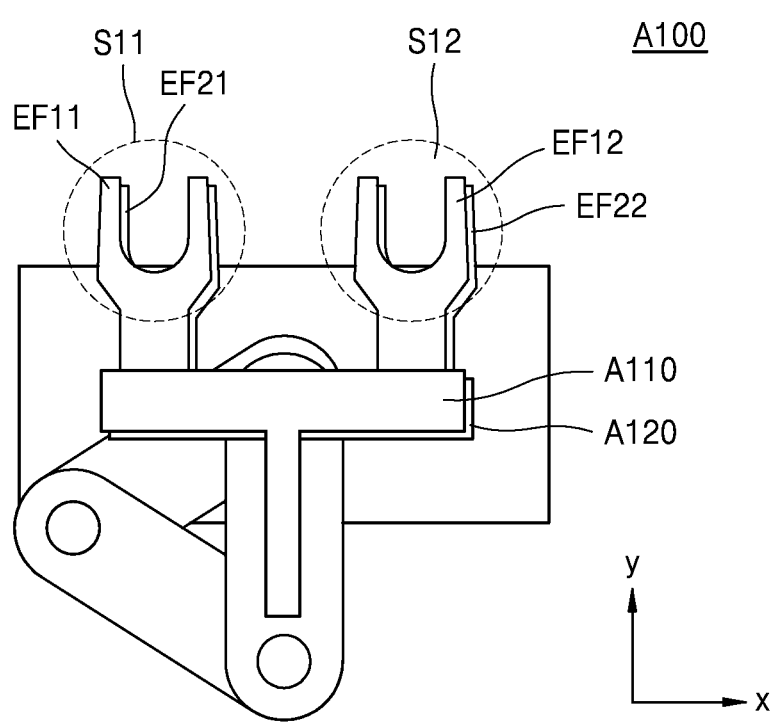
FIGS. 3A and 3B are schematic diagrams of a transfer arm according to an exemplary embodiment.
Figure 3B:
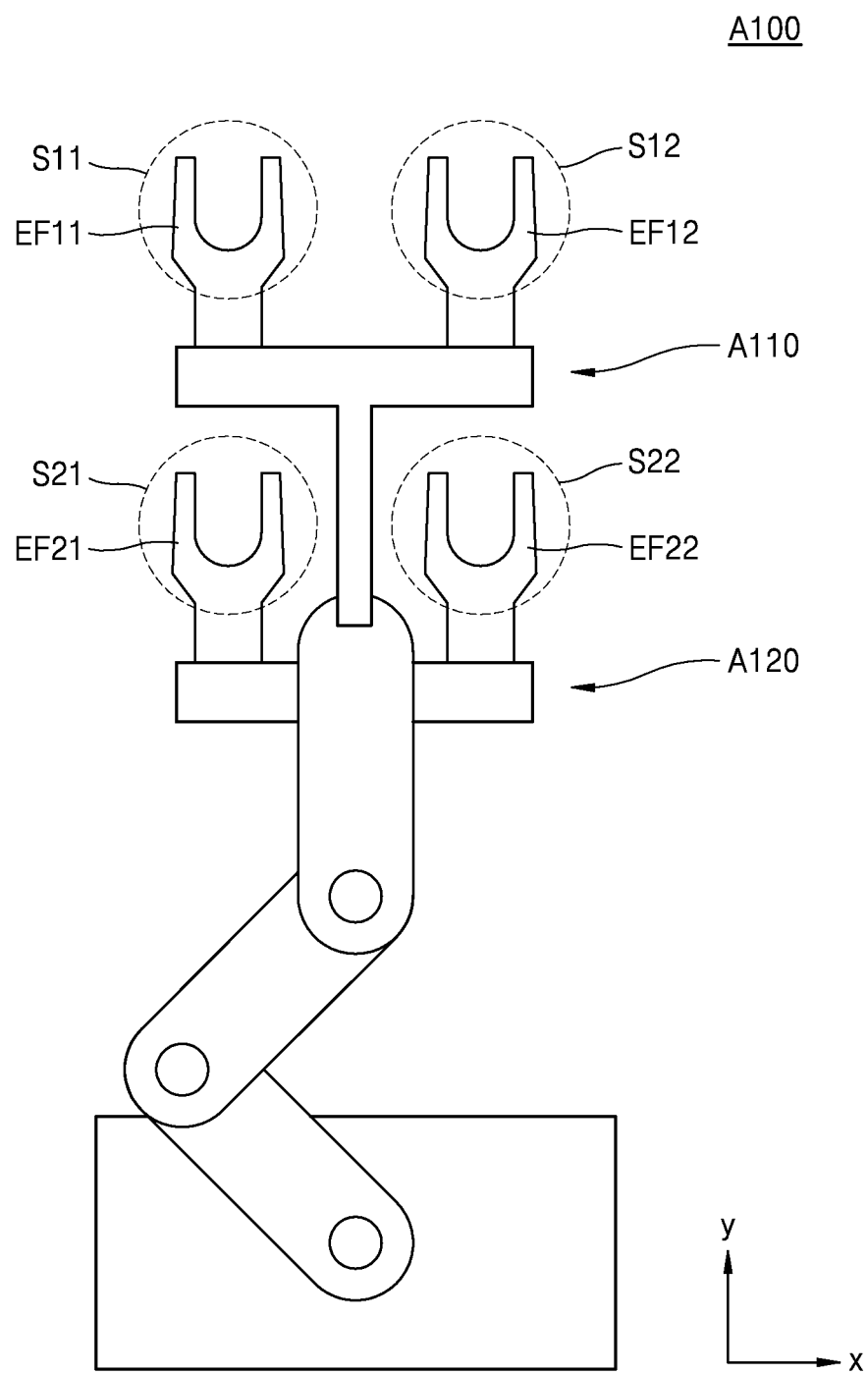

FIGS. 3A and 3B are conceptual diagrams of the transfer arm A100 according to the exemplary embodiment. In particular, FIG. 3A shows a state where the transfer arm A100 is retracted, and FIG. 3B shows a state where the transfer arm A100 extends.

Referring to FIGS. 3A and 3B, the transfer arm A100 may include two or more transfer sub-arms A110 and A120. For example, the transfer arm A100 may include a first transfer sub-arm A110 and a second transfer sub-arm A120. The first transfer sub-arm A110 and the second transfer sub-arm A120 may be located on and under each other so as to overlap with each other.

Main driving portions of the first transfer sub-arm A110 and the second transfer sub-arm A120 are not limited to the examples shown in FIGS. 3A and 3B. In some exemplary embodiments, the main driving portion of each of the first transfer sub-arm A110 and the second transfer sub-arm A120 may have various structure, e.g., a 3-link selective compliant articulated robot arm (SCARA), a 4-link SCARA, a bisymmetric arm, a frog-leg/scissors type arm, and a linear sliding arm.

In some exemplary embodiments, the number of transfer sub-arms may be equal to a value of m of the stations that are arranged as a matrix in the load-lock chamber 110 shown in FIG. 2. The plurality of transfer sub-arms may be arranged at different heights from each other.

Each of the first transfer sub-arm A110 and the second transfer sub-arm A120 may include a plurality of end effectors EF11, EF12, EF21, and EF22. That is, the first transfer sub-arm A110 may include two end effectors EF11 and EF12, and the second transfer sub-arm A120 may include two end effectors EF21 and EF22.

In some exemplary embodiments, in each of the transfer sub-arms A110 and A120, the number of end effectors may be equal to a value of n, that is, the number of stations arranged as a matrix in the load-lock chamber 110 shown in FIG. 2.

When the transfer arm A100 is retracted, the first transfer sub-arm A110 and the second transfer sub-arm A120 may be located on and under each other so as to overlap with each other. When the transfer arm A100 is extended, the first transfer sub-arm A110 and the second transfer sub-arm A120 may be located so as not to overlap with each other. In particular, when the transfer arm A100 is extended, arrangements and intervals of substrates S11, S12, S21, and S22 located on the end effectors EF11, EF12, EF21, and EF22 may be substantially equal to those of the load-lock stations 112.

A mechanism about relative movements between the first transfer sub-arm A110 and the second transfer sub-arm A120 may be implemented by one of ordinary skill in the art, and thus, detailed descriptions thereof are omitted.

In general, in the processing chambers 130a, 130b, 130c, and 130d (see FIG. 1), in which the chamber stations are arranged as a matrix, a rotary arm for transferring the substrates located at a carrying entrance to a side far from the entrance is provided. However, according to another exemplary embodiment, the rotary arm may not be provided in the processing chambers 130a, 130b, 130c, and 130d.

Figure 4A:
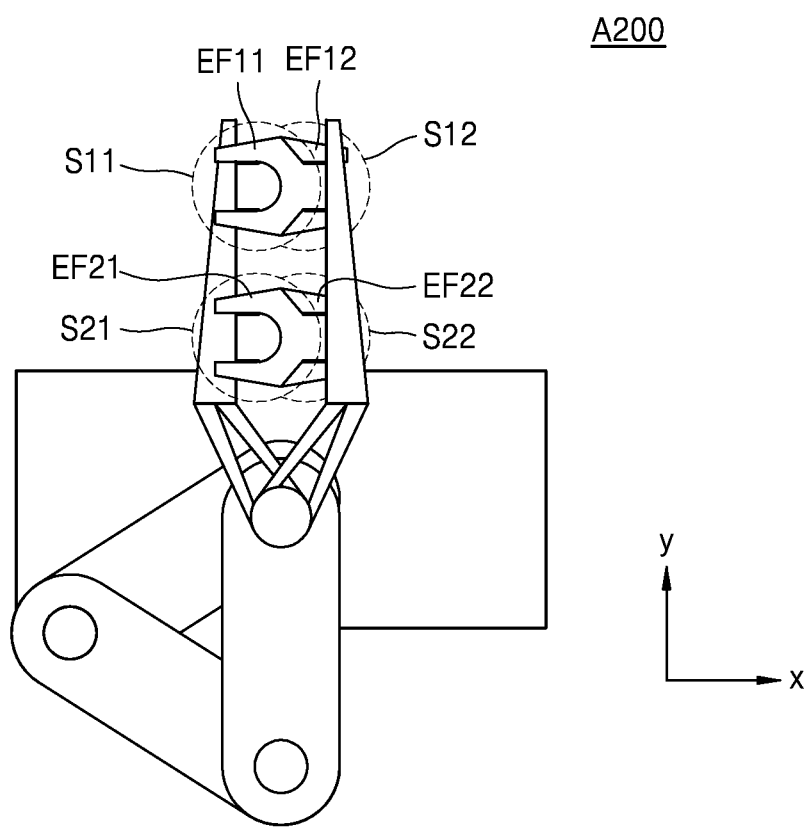
FIGS. 4A and 4B are schematic diagrams of a transfer arm according to another exemplary embodiment.
Figure 4B:
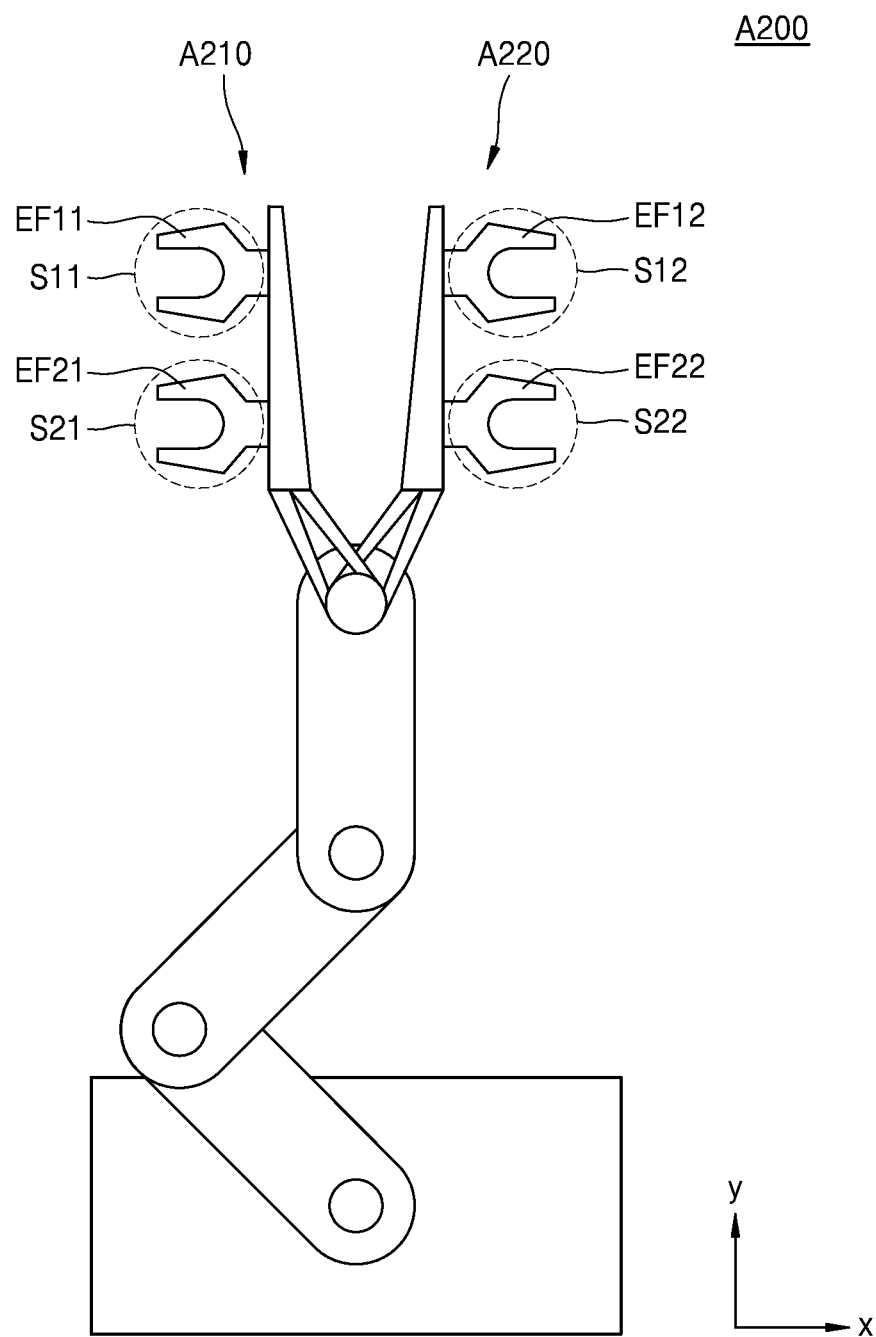

FIGS. 4A and 4B are conceptual diagrams showing a transfer arm A200 according to another exemplary embodiment. In particular, FIG. 4A shows a state in which the transfer arm A200 is retracted and FIG. 4B shows a state in which the transfer arm A200 is extended.

Referring to FIGS. 4A and 4B, the transfer arm A200 may include two or more transfer sub-arms A210 and A220. That is, the transfer arm A200 may include a third transfer sub-arm A210 and a fourth transfer sub-arm A220. The third transfer sub-arm A210 and the fourth transfer sub-arm A220 may be disposed on and under each other so as to overlap with each other.

In some exemplary embodiments, the number of transfer sub-arms may be equal to a value of n that is the number of the stations arranged as a matrix in the load-lock chamber 110 of FIG. 2.

Each of the third transfer sub-arm A210 and the fourth transfer sub-arm A220 may include a plurality of end effectors EF11, EF12, EF21, and EF22. That is, the third transfer sub-arm A210 may include two end effectors EF11 and EF21 and the fourth transfer sub-arm A220 may include two end effectors EF12 and EF22.

In some exemplary embodiments, in each of the third and fourth transfer sub-arms A210 and A220, the number of end effectors may be equal to a value of m that is the number of stations arranged as a matrix in the load-lock chamber 110 of FIG. 2.

When the transfer arm A200 is retracted, the third transfer sub-arm A210 and the fourth transfer sub-arm A220 may be located on and under each other so as to overlap with each other. When the transfer arm A200 is extended, the third transfer sub-arm A210 and the fourth transfer sub-arm A220 may be located so as not to overlap with each other. In particular, when the transfer arm A200 is extended, arrangements and intervals of the substrates S11, S12, S21, and S22 located on the end effectors EF11, EF12, EF21, and EF22 may be substantially the same as those of the load-lock stations 112.

A mechanism about relative movements between the third transfer sub-arm A210 and the fourth transfer sub-arm A220 may be implemented by one of ordinary skill in the art, and thus, detailed descriptions thereof are omitted.

Referring to FIGS. 3A, 3B, 4A, and 4B, the plurality of end effectors EF11, EF12, EF21, and EF22 may be combined with each other in the x direction to configure one transfer sub-arm, or may be combined with each other in the y direction to configure one transfer sub-arm. In the exemplary embodiment illustrated in FIGS. 3A and 3B, the plurality of end effectors EF11, EF12, EF21, and EF22 are combined in the x direction to form the first transfer sub-arm A110 and the second transfer sub-arm A120. In the exemplary embodiment illustrated in FIGS. 4A and 4B, the plurality of end effectors EF11, EF12, EF21, and EF22 are combined in they direction to form the third transfer sub-arm A210 and the fourth transfer sub-arm A220.

Figure 5:
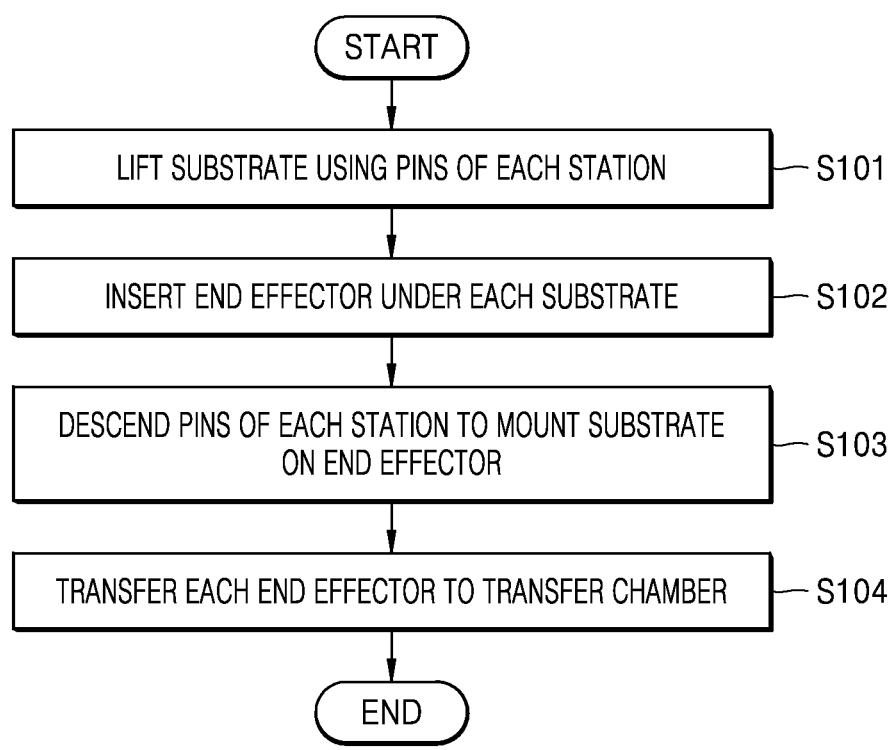
FIG. 5 is a flowchart illustrating a method of unloading substrates in a load-lock chamber or processing chamber by using transfer arms.
Figure 6:
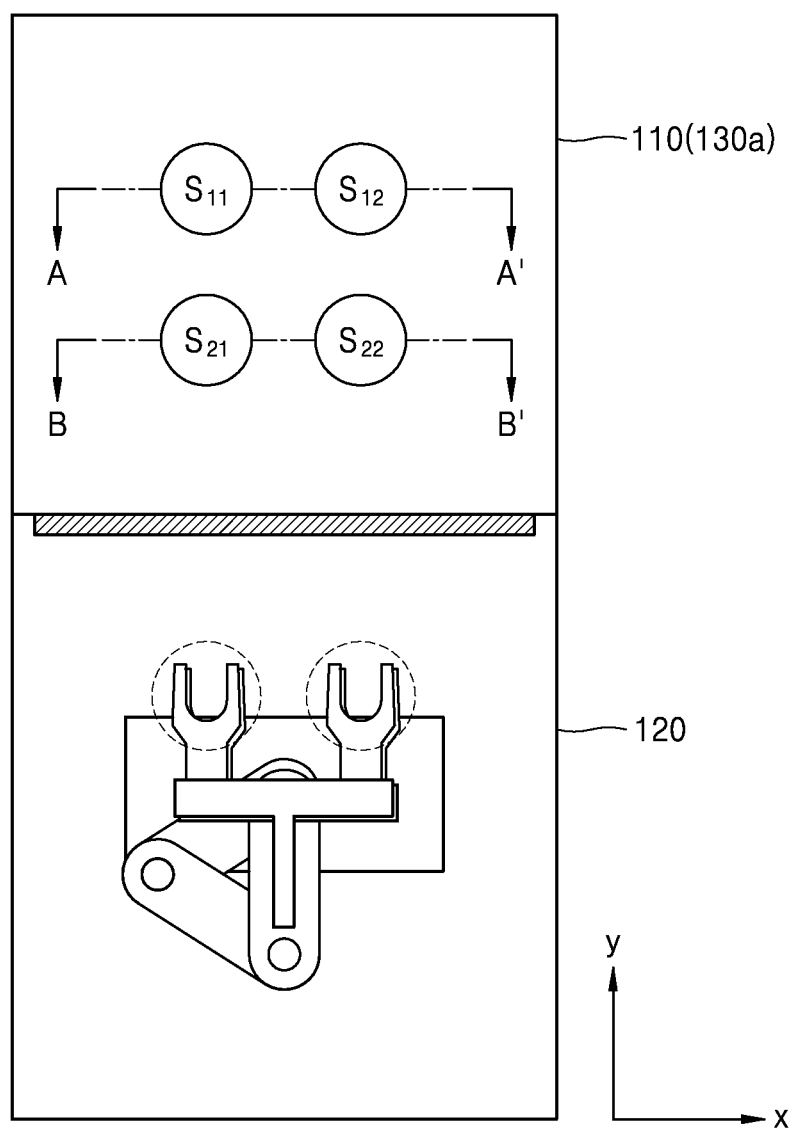
FIG. 6 is a plan view illustrating a process of unloading substrates from a load-lock chamber or a processing chamber to a transfer chamber.
Figure 7A:
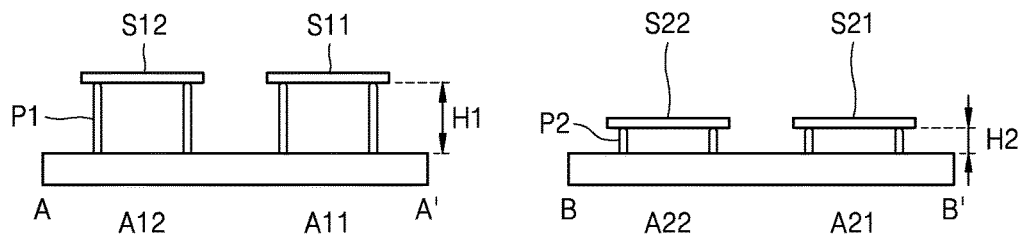
FIGS. 7A to 7C are cross-sectional views taken along a line A-A' and a line B-B' of FIG. 6, and illustrating a process of unloading the substrates from stations.
Figure 7B:
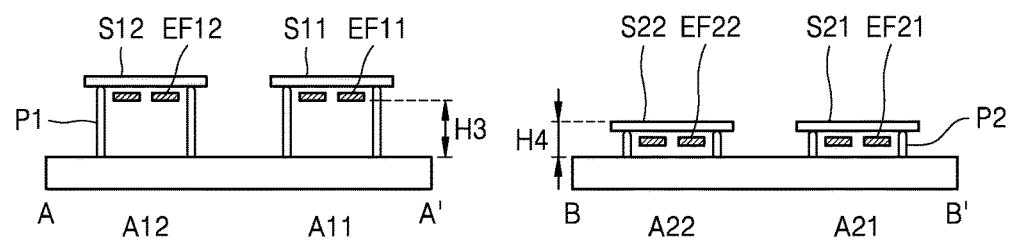
Figure 7C:
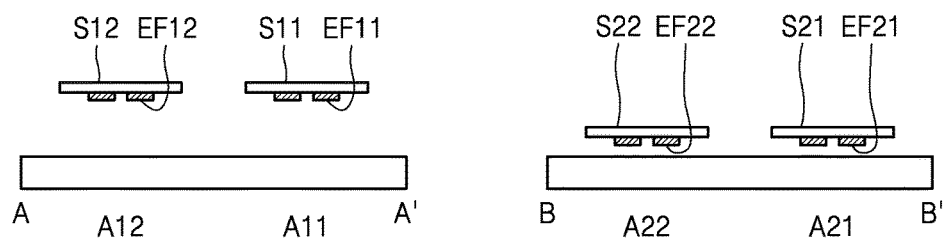

FIG. 5 is a flowchart illustrating a method of unloading the substrates in the load-lock chamber 110 or the processing chambers by using the transfer arms A100 and A200. FIG. 6 is a plan view showing unloading of the substrates from the load-lock chamber or the processing chamber to the transfer chamber. FIGS. 7A to 7C are cross-sectional views taken along a line A-A' and B-B' of FIG. 6, and show the substrates according to unloading stages.

Referring to FIGS. 5, 6, and 7A, the substrates S11, S12, S21, and S22 are placed on the stations in the load-lock chamber 110 or the processing chamber 130a. The substrates S11, S12, S21, and S22 may be lifted by pins P1 and P2 to be unloaded from the load-lock chamber 110 or the processing chamber 130a (S101). Here, the elevation heights of the substrates S11, S12, S21, and S22 may be different from each other according to locations of the stations. For example, the substrates S11 and S12 located in a first row may be lifted to a first height H1, and the substrates S21 and S22 located in a second row may be lifted to a second height H2. The first height H1 may be higher than the second height H2.

In order to lift one substrate, three pins are generally necessary. If the first height H1 is lower than the second height H2, the end effectors that are inserted to unload the substrates S11 and S12 located in the first row may be interfered with by the pins P2 for lifting the substrates S21 and S22 located in the second row.

Referring to FIGS. 5, 6, and 7B, the end effectors EF11, EF12, EF21, and EF22 may be inserted under the substrates S11, S12, S21, and S22, respectively (S102). In FIG. 7B, the end effectors EF11, EF12, EF21, and EF22 are simultaneously inserted, but may be inserted sequentially according to a predetermined rule. For example, the end effectors EF11 and EF12 may be inserted under the substrates S11 and S12 located in the first row, and after that, the end effectors EF21 and EF22 may be inserted under the substrates S21 and S22 located in the second row.

The end effectors EF11 and EF12 may be coupled to the first transfer sub-arm A110, and the end effectors EF21 and EF22 may be coupled to the second transfer sub-arm A120.

As illustrated with reference to FIGS. 6 and 7B, the end effectors EF11 and EF12 have to extend across upper portions of the substrates S21 and S22, and thus, a third height H3, that is, a height of lower surfaces of the end effectors EF11 and EF12 may be greater than a fourth height H4, that is, a height of the upper surfaces of the substrates S21 and S22 located in the second row.

In addition, the substrates S11, S12, S21, and S22 and the end effectors EF11, EF12, EF21, and EF22 corresponding to the substrates S11, S12, S21, and S22 need some intervals therebetween for freely inserting the end effectors.

Referring to FIGS. 5, 6, and 7C, since the pins P1 and P2 are descended, the substrates S11, S12, S21, and S22 may be mounted on the upper surfaces of the corresponding end effectors EF11, EF12, EF21, and EF22 (S103). In addition, the end effectors EF11, EF12, EF21, and EF22 are retracted into the transfer chamber 120, and then, the substrates S11, S12, S21, and S22 may be unloaded from the load-lock chamber 110 or the processing chamber 130a to be transferred (S104).

As described above, according to the substrate processing apparatus according to one or more exemplary embodiments, the plurality of substrates in the load-lock chamber or the processing chamber, in particular, four or more substrates, may be transferred into the transfer chamber at once, and thus, throughput of the product manufacturing may be improved.

In particular, a mechanism for rotating the stations in the load-lock chamber or the processing chamber and/or a chamber transfer arm for transferring the substrates between a plurality of reactors in the processing chamber are not necessary, and thus, the substrate may be processed rapidly. In addition, equipment may be simplified, and thus, a downtime that is necessary for maintenance may be reduced, and thereby improving throughput.

FIGS. 5, 6, and 7A to 7C illustrate the unloading of the substrates. One of ordinary skill in the art may appreciate that the substrate may be loaded in an opposite order to the above processes described with reference to FIGS. 5, 6, and 7A to 7C.

In some exemplary embodiment, the substrates in the load-lock chamber 110 may be loaded/unloaded by using a rotation mechanism. Referring back to FIG. 6, stations A11, A12, A21, and A22 (see FIG. 2) on which the substrates S11, S12, S21, and S22 are located may be disposed on one rotation mechanism, e.g., a disk that is rotatable. When unloading the substrates S11, S12, S21, and S22, the transfer arm A100 may primarily unload the substrates S21 and S22 located in the second row. In addition, the other substrates S11 and S12 may be located toward the transfer chamber by rotating the rotation mechanism by 180°. Accordingly, distances between the stations A11, A12, A21, and A22 and the transfer arm A100 may vary. Next, the transfer arm A100 may unload the other substrates S11 and S12.

Also, the stations A11, A12, A21, and A22 may be formed of a metal material. The substrates S11, S12, S21, and S22 that have been processed in the processing chamber and returned to the load-lock chamber 110 may be at a high temperature. When the substrates S11, S12, S21, and S22 are loaded on the stations A11, A12, A21, and A22, the temperature of the substrates S11, S12, S21, and S22 may be rapidly lowered through a surface contact. Thus, an additional substrate cooling device may not be necessary in the load-lock chamber 110.

In some exemplary embodiments, a process of centering the location of each substrate may be necessary for loading the substrate more precisely.

Figure 9A:
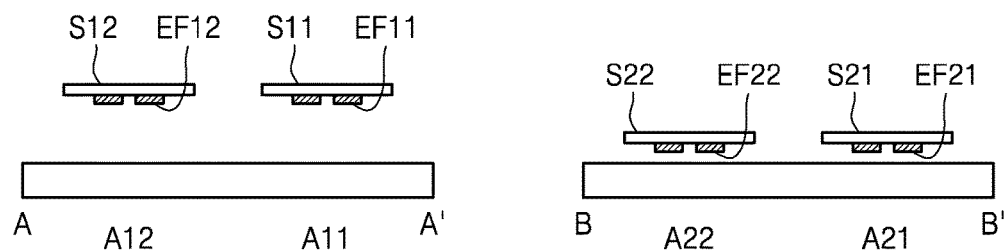
FIGS. 9A to 9G are cross-sectional views taken along a line A-A' and a line B-B' of FIG. 6, and illustrating processes of loading substrates on stations by further performing a centering process.

FIG. 8 is a flowchart illustrating a method of loading substrates on the stations by further performing a centering process. FIGS. 9A to 9G are cross-sectional views taken along a line A-A' and B-B' of FIG. 6, and show processes of loading the substrates on the stations, including the centering process according to the exemplary embodiment. Referring to FIGS. 8 and 9A, the substrates S11, S12, S21, and S22 to be loaded may be carried into the chamber (S201). The chamber may be the load-lock chamber 110 or the processing chamber 130a.

The substrates S11, S12, S21, and S22 may be carried into the chamber 110 or 130a while being supported by the end effectors EF11, EF12, EF21, and EF22. As shown in FIG. 3B, the end effectors EF11 and EF12 may be coupled to the first transfer sub-arm A110, and the end effectors EF21 and EF22 may be coupled to the second transfer sub-arm A120.

Since the end effectors EF11 and EF12 are coupled to the first transfer sub-arm A110, the movement of the end effector EF11 may affect the location of the end effector EF12, and vice versa. Moreover, since the end effectors EF21 and EF22 are coupled to the second transfer sub-arm A120, the movement of the end effector EF21 may affect the location of the end effector EF22, and vice versa.

Figure 9B:
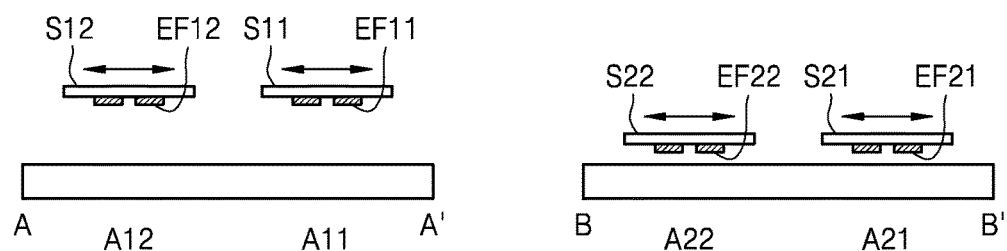

Referring to FIGS. 8 and 9B, the centering of the substrates S12 and S22 located in the second column is performed (S202). That is, locations of the first transfer sub-arm A110 and the second transfer sub-arm A120 may be adjusted appropriately so that the substrates S12 and S22 may be positioned exactly on locations that the substrates S12 and S22 are to be loaded. In FIG. 9B, left and right arrows are only shown, but the locations of the first transfer sub-arm A110 and the second transfer sub-arm A120 may be adjusted in back and forth directions (directions along a line of sight of FIG. 9B), as well as the left and right directions.

Even if one of the substrates S11 and S12 supported by the end effectors EF11 and EF12 of the first transfer sub-arm A110 is exactly positioned on a target location, the other may not be necessarily positioned exactly on the target location. This may be caused by an error generated in a process of loading the substrate from another chamber or in a transfer process.

Therefore, the centering process needs to be performed independently with respect to the plurality of substrates supported by one transfer sub-arm. That is, although the end effectors EF11 and EF12 are commonly connected to the first transfer sub-arm A110, a centering with respect to the substrate S11 may be additionally necessary even when the centering of the substrate 512 is finished. Also, although the end effectors A21 and A22 are commonly connected to the first transfer sub-arm A120, a centering of the substrate S21 may be additionally necessary even when the centering of the substrate S22 is finished.

Figure 9C:
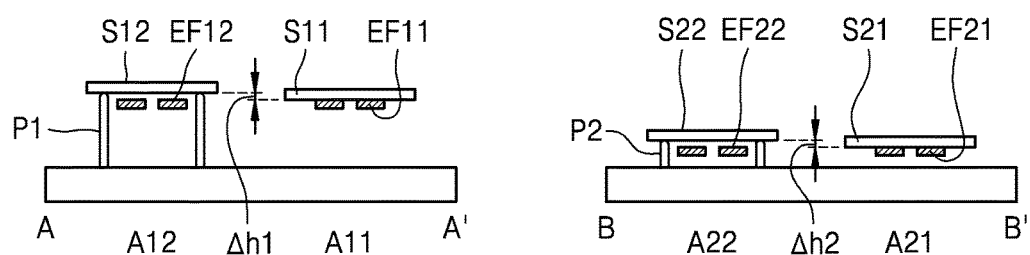

Referring to FIGS. 8 and 9C, the pins P1 and P2 may be lifted in order to lift the substrates S12 and S22 that have undergone the centering process from the corresponding end effectors EF12 and EF22 (S203). Due to the above pins P1 and P2, the lower surfaces of the substrates S12 and S22 may be higher than the lower surfaces of the other substrates S11 and S21. For example, the lower surface of the substrate S12 may be higher than the lower surface of the substrate S11 by Δh1. In addition, the lower surface of the substrate S22 may be higher than the lower surface of the substrate S21 by Δh2.

Meanwhile, a height of lifting the substrate S22 is restricted by the end effector EF12. That is, if the substrate S22 is excessively lifted, the upper surface of the substrate S22 may be interfered with by the end effector EF12. Therefore, the substrate S22 has to be lifted so that the upper surface thereof may be lower than the lower surface of the end effector EF12.

Figure 9D:
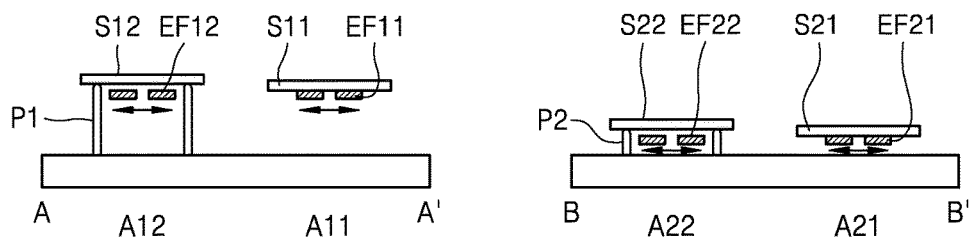

Referring to FIGS. 8 and 9D, the centering process may be performed with respect to the substrates S11 and S21 located in the first column (S204). That is, locations of the first transfer sub-arm A110 and the second transfer sub-arm A120 may be appropriately adjusted so that the substrates S11 and S21 may be positioned exactly on the locations that the substrates S11 and S21 have to be loaded. In FIG. 9D, left and right arrows are only shown, but the locations of the first transfer sub-arm A110 and the second transfer sub-arm A120 may be adjusted in back and forth directions (directions along a line of sight of FIG. 9B), as well as the left and right directions.

When the location of the end effector EF11 is adjusted for centering the substrate S11, the location of the end effector EF12 is also changed. However, since the substrate S12 is in a lifted state from the end effector EF12 by the pins P1, the location of the substrate S12 is not changed and the substrate S12 may be maintained at the centering location.

Likewise, when the location of the end effector EF21 is adjusted for centering the substrate S21, the location of the end effector EF22 is also changed. However, since the substrate S22 is in a lifted state from the end effector EF22 by the pins P2, the location of the substrate S22 is not changed and the substrate S22 may be maintained at the centering location.

Figure 9E:
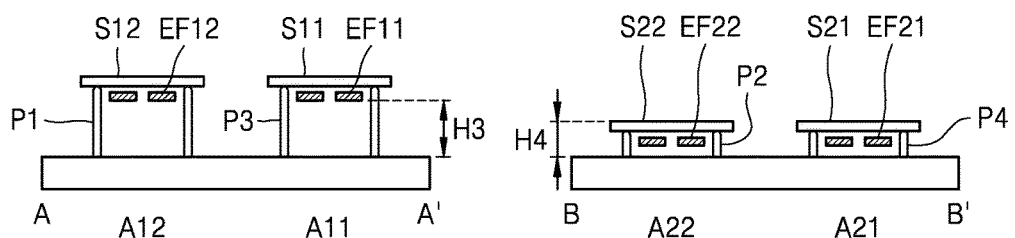

Referring to FIGS. 8 and 9E, the pins P3 and P4 may be lifted in order to lift the substrates S11 and S21 that have undergone the centering process in the first column from the corresponding end effectors EF11 and EF21 (S205). However, the height of lifting the substrate S21 may be restricted due to the end effector EF11. That is, if the substrate S21 is excessively lifted, the upper surface of the substrate S21 may be interfered with by the end effector EF11. Therefore, the substrate S21 has to be lifted so that the upper surface thereof is lower than the lower surface of the end effector EF11.

In the above description, the centering of the substrates S12 and S22 in the second column is performed first, and then, the centering of the substrates S11 and S21 in the first column is performed. However, in some embodiments, the centering of the substrates S11 and S21 in the first column may be performed first, and then, the centering of the substrates S12 and S22 in the second column may be performed.

Figure 9F:
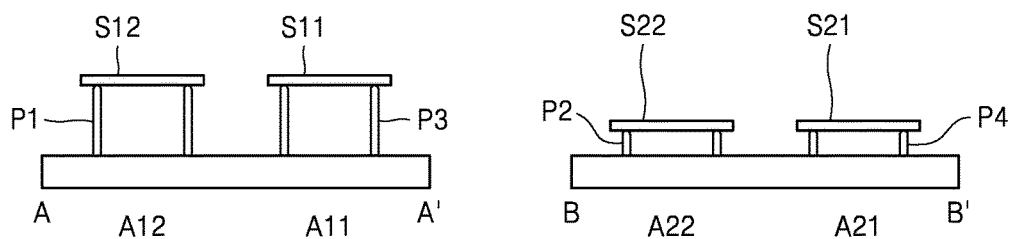

Referring to FIGS. 8 and 9F, the end effectors EF11, EF12, EF21, and EF22 may be removed from the chamber (S206). To do this, the first transfer sub-arm A110 and the second transfer sub-arm A120 are arranged to overlap with each other, and the transfer arm A100 may be retracted into the transfer chamber 120.

Figure 9G:
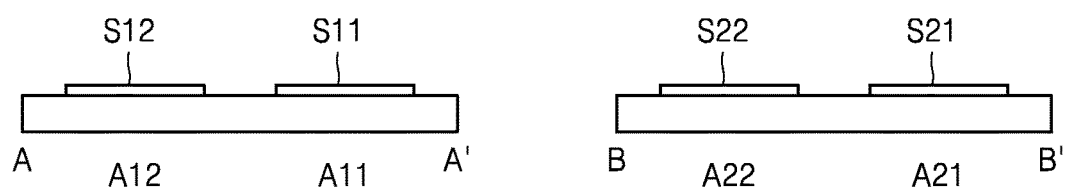

Referring to FIGS. 8 and 9G, the pins P1, P2, P3 and P4 supporting the substrates S12, S22, S11 and S21 respectively are descended to mount the substrates S12, S22, S11 and S21 on the stations A12, A22, A11 and A21 (S207).

The case of using the transfer arm A100 illustrated in FIGS. 3A and 3B is described above, but one of ordinary skill would appreciate that the centering process may be performed in a similar way in a case of using the transfer arm A200 illustrated with reference to FIGS. 4A and 4B. In more detail, when the centering and loading of the substrates are performed by using the transfer arm A100 illustrated in FIGS. 3A and 3B, the substrates S12 and S22 located in the second A1 column are centered first to be mounted on the stations A12 and A22, and after that, the substrates S11 and S21 located in the first column are centered to be mounted on the stations A11 and A21. Moreover, in a case of using the transfer arm A200 illustrated with reference to FIGS. 4A and 4B, the substrates S12 and S11 located in the first row are centered and mounted on the stations A12 and A11, and the substrates S22 and S21 located in the second row are centered and mounted on the other stations A22 and A21. That is, the loading/unloading order of the substrates may vary depending on the direction and shape of arranging the transfer sub-arms with respect to the proceeding direction of the transfer arms A100 and A200.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A substance processing apparatus comprising:
a load-lock chamber;
a transfer chamber positioned proximate to the load-lock chamber;
a transfer arm located within the transfer chamber; and
one or more processing chambers positioned proximate to the transfer chamber wherein each chamber of the load lock chamber and the one or more processing chambers includes:
a plurality of stations arranged in a matrix of m rows and n columns, wherein m and n are integers between 2 and 10; wherein the m rows include a first row located proximate an entrance to the chamber and a second row located rearwardly of the first row; and
a plurality of pins provided at each of the plurality of stations, said plurality of pins being movable between an extended position and a retracted position relative to an upper surface of the associated station; and, when in the extended position, the plurality of pins is adapted to hold a substance at a distance above the upper surface of the associated station; and wherein the plurality of pins in the plurality of stations in the second row are configured to hold the substance at a greater distance from the upper surface when in the extended position than are the plurality of pins in the plurality of stations in the first row; and
wherein the transfer arm is adapted to transfer the substance between the load-lock chamber and the one or more processing chambers.

2. The substance processing apparatus of claim 1, wherein the transfer arm comprises m transfer sub-arms having different heights from each other.

3. The substance processing apparatus of claim 2, wherein each of the transfer sub-arms comprises n end effectors.

4. The substance processing apparatus of claim 3, wherein the n end effectors are arranged in a direction perpendicular to a direction in which the end effectors of each transfer sub-arm enter and exit from the load-lock chamber.

5. The substance processing apparatus of claim 2, wherein the m transfer sub-arms are configured to sequentially unload substances from the load-lock chamber or to sequentially load substances into the load-lock chamber.

6. The substance processing apparatus of claim 2, wherein at least two transfer sub-arms are configured to simultaneously unload the substances from the load-lock chamber or to simultaneously load the substances into the load-lock chamber.

7. The substance processing apparatus of claim 1, wherein the transfer arm comprises n transfer sub-arms having different heights from each other.

8. The substance processing apparatus of claim 7 wherein each of the transfer sub-arms comprises m end effectors.

9. The substance processing apparatus of claim 8, wherein the m end effectors are arranged in parallel with a direction in which the end effectors of each transfer sub-arm enter and exit from the load-lock chamber.

10. The substance processing apparatus of claim 7, wherein the n transfer sub-arms are configured to sequentially unload substances from the load-lock chamber or to sequentially load substances into the load-lock chamber.

11. The substance processing apparatus of claim 1, wherein the processing chamber does not include a processing chamber transfer arm for transferring the substances between the plurality of processing chamber stations.

12. The substance processing apparatus of claim 1, wherein the plurality of load-lock stations are arranged on one rotation mechanism, and the rotation mechanism is configured to rotate in order to vary distances between the plurality of load-lock stations and the transfer arm.

13. A substance processing apparatus comprising:
a load-lock chamber;
a transfer chamber positioned proximate to the load-lock chamber;
one or more processing chambers positioned proximate to the transfer chamber; and
a transfer arm provided in the transfer chamber and being operable to move a plurality of substances between the load-lock chamber and the one or more processing chambers;
wherein the one or more processing chambers include a plurality of processing chamber stations arranged to accommodate the plurality of substances as a matrix of m×n, and the one or more processing chambers do not include a transfer arm for transferring the plurality of substances between the plurality of processing chamber stations; wherein m and n are integers between 2 and 10, m is a number of processing chamber stations in a direction in which a front end of the transfer arm extends through an entrance and into the processing chamber, and n is a number of processing chamber stations in a direction perpendicular to the direction in which the front end of the transfer arm extends into the processing chamber; and
wherein the front end of the transfer arm is provided on a first section of the transfer arm and a length of the first section is oriented perpendicular to the entrance when the front end is inserted through the entrance; and
wherein the transfer arm includes a plurality of effectors that extend outwardly at right angles from the length of the first section; and each end effector is U-shaped and includes an opening that is oriented parallel to the entrance when the front end is inserted through the entrance.

* * * * *

UNITED STATES PATENT AND TRADEMARK OFFICE
CERTIFICATE OF CORRECTION

PATENT NO. : 10,403,523 B2  
APPLICATION NO. : 15/211538  
DATED : September 3, 2019  
INVENTOR(S) : Soo Hyun Kim, Dae Youn Kim and Izumi Arai It is certified that error appears in the above-identified patent and that said Letters Patent is hereby corrected as shown below:

In the Claims

Column 12, Line 26 (Claim 1) "substance" should be changed to --substrate--.

Column 12, Line 46 (Claim 1) "substance" should be changed to --substrate--.

Column 12, Line 50 (Claim 1) "substance" should be changed to --substrate--.

Column 12, Line 54 (Claim 1) "substance" should be changed to --substrate--.

Column 12, Line 57 (Claim 2) "substance" should be changed to --substrate--.

Column 12, Line 60 (Claim 3) "substance" should be changed to --substrate--.

Column 12, Line 62 (Claim 4) "substance" should be changed to --substrate--.

Column 12, Line 66 (Claim 5) "substance" should be changed to --substrate--.

Column 13, Line 1 (Claim 5) "substances" should be changed to --substrates--.

Column 13, Line 3 (Claim 6) "substance" should be changed to --substrate--.

Column 13, Line 5 (Claim 6) "substances" should be changed to --substrates--.

Column 13, Line 8 (Claim 7) "substance" should be changed to --substrate--.

Column 13, Line 11 (Claim 8) "substance" should be changed to --substrate--.

Column 13, Line 13 (Claim 9) "substance" should be changed to --substrate--.

Signed and Sealed this  
Twenty-first Day of April, 2020

Andrei Iancu  
*Director of the United States Patent and Trademark Office*

CERTIFICATE OF CORRECTION (continued)
U.S. Pat. No. 10,403,523 B2

Column 13, Line 17 (Claim 10) "substance" should be changed to --substrate--.

Column 13, Line 19 (Claim 10) "substance" should be changed to --substrate--.

Column 13, Line 21 (Claim 11) "substance" should be changed to --substrate--.

Column 13, Line 23 (Claim 11) "substances" should be changed to --substrates--.

Column 13, Line 25 (Claim 12) "substance" should be changed to --substrate--.

Column 13, Line 30 (Claim 13) "substances" should be changed to --substrates--.

Column 14, Line 4 (Claim 13) "substances" should be changed to --substrates--.

Column 14, Line 10 (Claim 13) "substances" should be changed to --substrates--.

Column 14, Line 13 (Claim 13) "substance" should be changed to --substrate--.